(12) United States Patent
Pan et al.

(10) Patent No.: US 6,306,714 B1
(45) Date of Patent: Oct. 23, 2001

(54) METHOD TO FORM AN ELEVATED S/D CMOS DEVICE BY CONTACTING S/D THROUGH THE CONTACT OF OXIDE

(75) Inventors: Yang Pan; James Yongmeng Lee, both of Singapore (SG); Ying Keung Leung, Aberdeen (HK); Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/713,802

(22) Filed: Nov. 16, 2000

(51) Int. Cl.$^7$ .................................................. H01L 21/336
(52) U.S. Cl. .............................................................. 438/300
(58) Field of Search .................................. 438/300, 527, 438/629, 685

(56) References Cited

U.S. PATENT DOCUMENTS

| | | | |
|---|---|---|---|
| 5,422,289 | 6/1995 | Pierce | 437/32 |
| 5,804,846 | 9/1998 | Fuller | 257/252 |
| 5,851,883 | 12/1998 | Gardner et al. | 438/275 |
| 6,015,727 | 1/2000 | Wanlass | 438/218 |
| 6,140,191 | * 10/2000 | Gardner et al. | 438/300 |
| 6,140,224 | * 10/2000 | Lin | 438/634 |
| 6,245,603 | * 6/2001 | Shinohara | 438/197 |

* cited by examiner

Primary Examiner—Charles Bowers
Assistant Examiner—Angel Roman
(74) Attorney, Agent, or Firm—George O. Saile; Rosemary L. S. Pike; William J. Stoffel

(57) ABSTRACT

A method of fabrication of an elevated source/drain (S/D) for a MOS device. A first insulating layer having a gate opening and source/drain openings is formed over a substrate. We form a LDD resist mask having opening over the source/drain openings over the first insulating layer. Ions are implanted through the source/drain openings. A first dielectric layer is formed on the substrate in the gate opening and source/drain openings. A gate is formed in the gate opening and raised source/drain (S/D) blocks in the source/drain openings. We remove the spacer blocks to form spacer block openings. We form second LDD regions by implanting ions through the spacer block openings. We form second spacer blocks in the spacer block openings. Plug opening are formed through the raised source/drain (S/D) blocks. Contact plugs are formed in the form plug opening.

15 Claims, 3 Drawing Sheets

METHOD TO FORM AN ELEVATED S/D CMOS DEVICE BY CONTACTING S/D THROUGH THE CONTACT OF OXIDE

BACKGROUND OF INVENTION

1) Field of the Invention

This invention relates generally to fabrication of semiconductor devices, and more particularly to the fabrication of an elevated contact to doped regions in a CMOS device.

2) Description of the Prior Art

The semiconductor industry has been advanced in an ever brisk pace, recently. In order to achieve high performance integrated circuits or high package density of a wafer, the sizes of semiconductor devices have become smaller and smaller than before in the field of Ultra Large Scale Integrated (ULSI) technologies.

Integrated circuits includes more than millions of devices in a specific area of a wafer and electrically connecting structure for connecting these devices to perform desired function. One of the typical devices is metal oxide semiconductor field effect transistor (MOSFET). The MOSFET has been widely, traditionally applied in the semiconductor technologies. As the trend of the integrated circuits, the fabrication of the MOSFET also meets various issues to fabricate them. The typically issue that relates to hot carriers injection is overcame by the development of lightly doped drain (LDD) structure.

As transistors are scaled down even further, short channel effect (SCE) are severe. There is a challenge to make elevated source/drain (S/D) to reduce the short channel effect (SCE).

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,804,846 (Fuller) that teaches a method for a self aligned elevated S/D by W layer and chemical-mechanical polish.

U.S. Pat. No. 5,422,289 (Pierce) shows elevated source/drain (S/D) formed by chemical-mechanical polish (CMP) a poly layer.

U.S. Pat. No. 6,015,727 (Wanlass) teaches a damascene source/drain (S/D) process.

U.S. Pat. No. 5,851,883 (Gardner et al.) shows a chemical-mechanical polish (CMP) gate and S/D process.

SUMMARY OF THE INVENTION

It is an object of the present invention to provide a method for fabricating a MOS device with improved short channel effect (SCE).

It is an object of the present invention to provide a method for fabricating a MOS transistor with an elevated source/drain (S/D).

It is an object of the present invention to provide a method for fabricating a MOS transistor with an elevated source/drain (S/D) and a metal plug contact through the elevated S/D to the doped source/drain (S/D) in the substrate.

It is an object of the present invention to provide a method for fabricating a MOS transistor a first and second lightly doped drains, with an elevated source/drain (S/D) and a metal plug contact through the elevated S/D to the doped source/drain (S/D) in the substrate.

To accomplish the above objectives, the present invention provides a method of fabrication of an elevated source/drain (S/D) for a MOS device can be summarized as follows. A first insulating layer is formed over a substrate. A gate opening and source/drain openings are created in the first insulating layer exposing the substrate. The first insulating layer between the gate opening and the source/drain (S/D) openings are spacer blocks. We form a LDD resist mask having opening over the source/drain openings over the first insulating layer. We implant ions through the source/drain openings to form first lightly doped drain regions in the substrate. Then we remove the LDD resist mask. A first dielectric layer is formed on the substrate in the gate opening and source/drain openings. We form a gate in the gate opening and raised source/drain (S/D) blocks in the source/drain openings. We remove the spacer blocks to form spacer block openings. We form second LDD regions by implanting ions through the spacer block openings. We form second spacer blocks in the spacer block openings. We form plug opening through the raised source/drain (S/D) blocks. We form contact plugs in the form plug opening.

The invention's first and second LDD, contact plugs and elevated S/D regions reduce the short channel effect (SCE). Key features of the invention are the:

elevated source/drain (S/D) blocks, the first and second LDD, and the plug contact.

The invention reduces SCE because the N+/{+ drain is formed by a diffusing of (n+) dopant from the poly layer. The junction can be extremely shallow. TiSix or CoSix can be formed on top of the poly layers without causing any junction leakage.

In addition, the invention provide a method that is very manufacturable and uses planarization processes to control thicknesses.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A preferred embodiment of the method of fabrication of an elevated source/drain (S/D) for a MOS device is described below.

Figure 8:
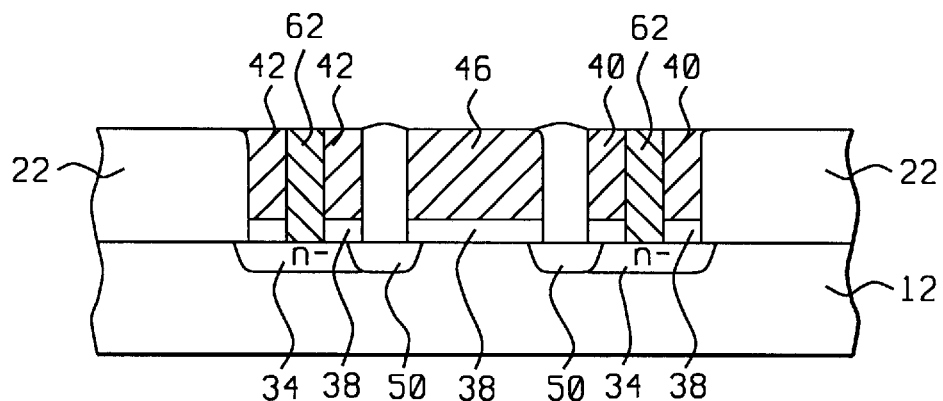

The present invention proposes a novel method to fabricate a self-aligned contact deep sub-micron meter gate MOSFET with first and second shallow extension source and drain junction (LDD) 34, 50 and plug contacts 62 through the elevated S/D 40 (See FIG. 8). In the present invention, the device operation speed can be increased by using the plug contact technology. The plug contact technology is an improvement over the salicide technology. The short channel effect can be suppressed by using invention's plug contacts, the elevated source and drain junction and first/second extension ultra-shallow source and drain junction.

Figure 1:
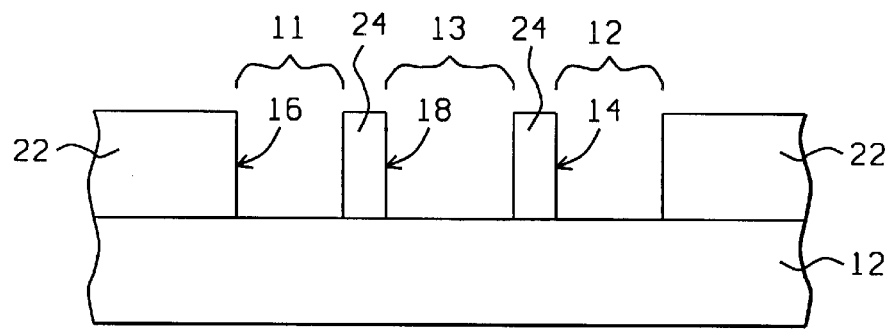
FIGS. 1 through 8 are cross sectional views for illustrating a method for manufacturing elevated source/drain (S/D) blocks according to the present invention.

As shown in FIG. 1, a first insulating layer is formed over a substrate 12. The first insulating layer is preferably comprised of silicon oxide, or silicon nitride ($Si_3N_4$). The first insulating layer preferably has a thickness of between about 1000 and 3000 Å. The substrate has at least a channel area 13 over which a gate will be subsequently formed and source/drain areas where source/drain (S/D) will be subsequently formed.

Still referring to FIG. 1, we form a gate opening 18 and source/drain openings 14 and 16 in the first insulating layer 22 exposing the substrate 10. The gate opening defines a channel region 13 in the substrate. The source/drain (S/D) openings 14 16 defining first LDD source/drain area 11 in the substrate. The gate opening 18 and the source/drain (S/D) openings 14 and 16 defining spacer blocks 24 of the first insulating layer.

Figure 2:
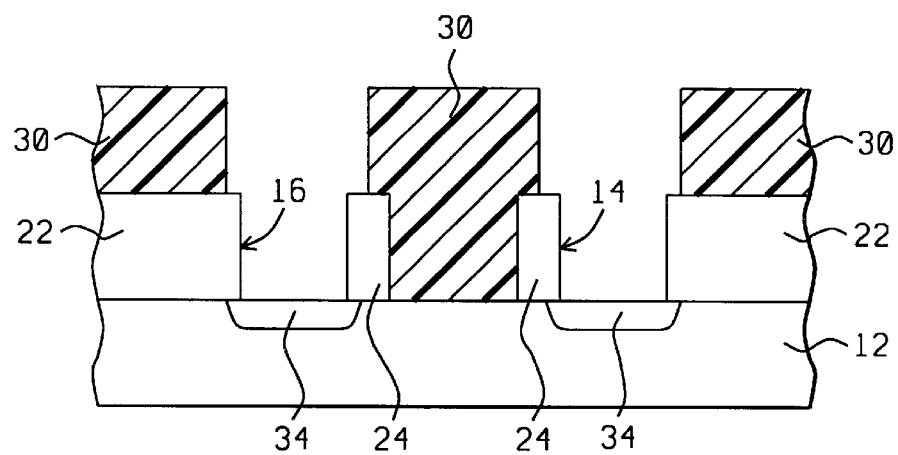

As shown in FIG. 2, we form a LDD resist mask 30 has openings over the source/drain openings 14 in the first insulating layer 22.

Still referring to FIG. 2, we implant ions through the source/drain openings 14 to form the first lightly doped drain regions 34 in the substrate 12. The first lightly doped drain regions 34 preferably have a concentration between 1E17 and 1E18 atom/cc and a depth below the substrate surface between about 0.08 and 0.15 µm.

Next, the LDD resist mask 30 is removed.

Figure 3:
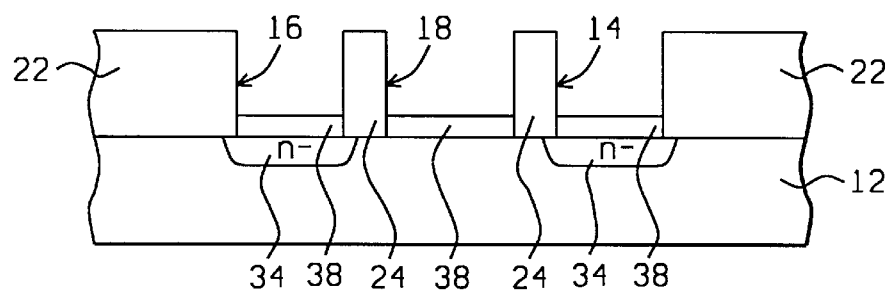

As shown in FIG. 3, we form a first dielectric layer 38 on the substrate 10 in the gate opening 18 and source/drain openings 14 and 16. The first dielectric layer over the channel area 13 (see FIG. 1) will act as the gate dielectric layer. The first dielectric layer 38 is preferably comprised of silicon oxide or other dielectric films and more preferably of oxide and has a thickness of between about 20 and 50 Å.

Figure 4:
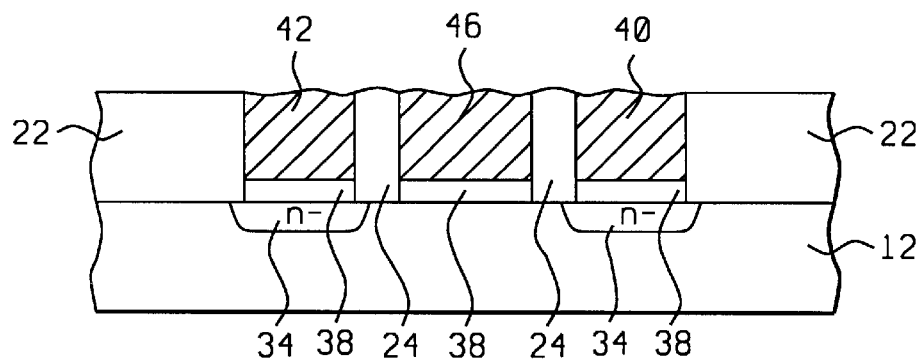

As shown in FIG. 4, we form a gate 46 in the gate opening 18 and raised source/drain (S/D) blocks 40 42 in the source/drain openings 14 and 16.

The gate 46 and the raised source/drain (S/D) blocks (elevated source/drain (S/D)) 40 and 42 are preferably fabricated by forming a conductive layer over the first insulating layer 22 and the first dielectric layer 38 and chemical-mechanical polish (CMP) the conductive layer. The gate 46 and the raised source/drain (S/D) blocks 40 42 (elevated source/drain (S/D)) are preferably comprised of polysilicon.

Figure 5:
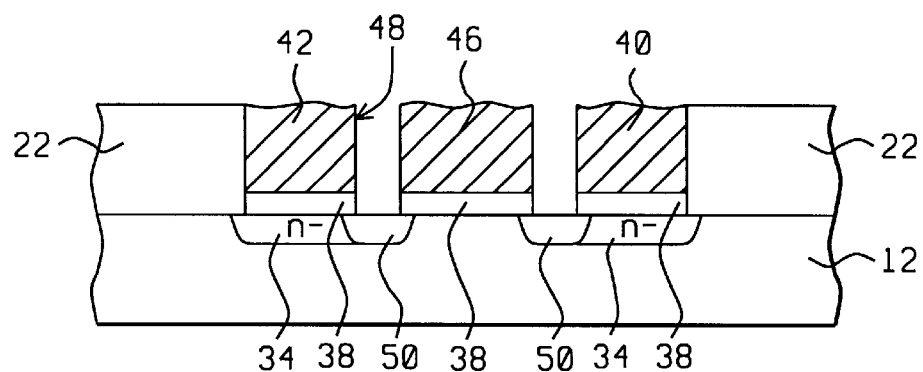

As shown in FIG. 5 we remove the spacer blocks 24 (see FIG. 4) to form spacer block openings 48. The spacer blocks 24 can be removed by fabricating a resist mask (not shown) have openings over the spacer blocks 24. Next, an etch is used to remove the spacer blocks. The resist mask is then removed.

As shown in FIG. 5, we form second LDD regions 50 by implanting ions through the spacer block openings 48. The second lightly doped drain regions 34 preferably have a concentration between 1E17 and 1E19 atom/cc and a depth between about 200 and 1500 Å.

The inventors have found that the second LDD regions 50 are very important because they are closer to the gate edge and have more impact on the device performance.

Figure 6:
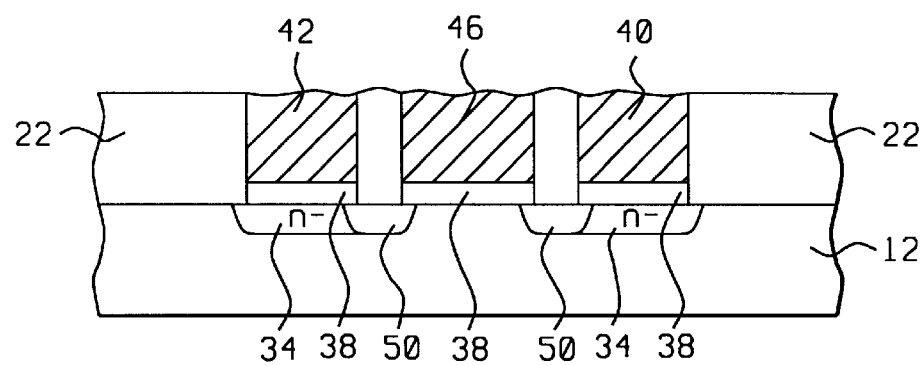

As shown in FIG. 6, we form second spacer blocks in the spacer block openings 48. The second spacer blocks are preferably formed by depositing a blank dielectric layer over the surface and planarizing (e.g., chemical-mechanical polish (CMP)) the blank dielectric layer. The second spacer blocks are preferably comprised of silicon oxide, and silicon nitride.

Figure 7:
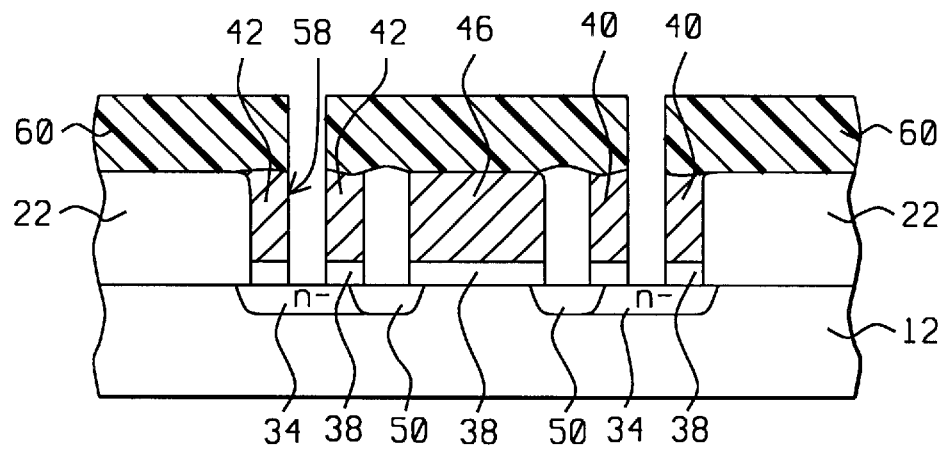

As shown in FIG. 7, we form plug opening 58 through the raised source/drain (S/D) blocks 40 and 42. A plug opening photoresist mask 60 is formed over substrate surface (e.g., the second spacer blocks, the gate 46, and the raised source/drain (S/D) blocks 40 42 first insulating layer 22.).

As shown in FIG. 8, the plug opening photoresist mask 60 is then removed.

As shown in FIG. 8, we form contact plugs 62 in the form plug opening 58. The contact plugs 62 are most preferably comprised of tungsten (W). The contact plugs 62 are preferably comprised of tungsten (W) or polysilicon. The contact plugs 62 are preferably formed by depositing a blanket W layer and chemical-mechanical polishing (CMP) the blanket W layer. The contact size (of the contact plugs) should be consistent with the design rule of the specific technology.

In addition, silicide contacts (not shown) (e.g., TiSix or CoSix) can be formed on top of the poly (e.g., 40 42 46) layers without causing any junction leakage. This is another major advantage.

BENEFITS OF THE INVENTION

The invention's first and second LDD, contact plugs and elevated S/D regions reduce the SCE. Key features of the invention are the:

(1) elevated source/drain (S/D) blocks 40, (2) the first and second LDD 34 and 50, and (3) the plug contact.

The invention reduces short channel effect (SCE) because the N+/p+ drain is formed by a diffusing of (n+) dopant from the poly layer. The junction can be extremely shallow. TiSix or CoSix can be formed on top of the poly layers without causing any junction leakage.

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge. Specific terminology of particular importance to the description of the present invention is defined below.

Silicon, as used in this application, includes polysilicon (polycrystalline silicon), amorphous silicon (non-crystalline silicon), monocrystalline silicon and silicon/germanium materials. Such silicon may be n- or p-doped, or undoped.

CVD refers to chemical vapor deposition. LPCVD refers to low pressure chemical vapor deposition. Ion implantation refers to the implantation of ions, for example, for doping a semiconductor substrate. Salicidation means formation of self-aligned silicide.

Electronic element refers to active electronic devices and passive component parts. Electrical conductor refers to a material which readily conducts electricity and includes metals, p-type material (semiconductor material that has been doped with an acceptor-type impurity and conducts current via hole migration), and n-type material (semiconductor material that has been doped with a donor-type impurity and conducts a current via electrons).

Oxide as used in the subject invention refers to silicon oxides and nitride as used herein refers to silicon nitride. The oxide may be doped or undoped, such as PSG (phosphosilicate glass) or BPSG (Boron doped PSG). An insulation layer or insulator layer refers to a layer having a high resistivity, which does not conduct electricity. It may act as a sodium barrier.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication, Such additional microelectronics layers may include, but are not limited to, microelectronics conductor layers, microelectronics semiconductor layers and microelectronics dielectric layers.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of an elevated source/drain (S/D) for a MOS device; comprising the steps of:
    a) forming a first insulating layer over a substrate;
    b) forming a gate opening and source/drain openings in said first insulating layer exposing said substrate; said gate opening defines a channel region in said substrate; said source/drain (S/D) openings define first LDD source/drain area in said substrate; said gate opening and said source/drain (S/D) openings defining spacer blocks of said first insulating layer;
    c) forming a LDD resist mask having openings over said source/drain openings in said first insulating layer;
    d) implanting ions through said source/drain openings form said first lightly doped drain regions in said substrate;
    e) removing said LDD resist mask;
    f) forming a first dielectric layer on said substrate in said gate opening and source/drain openings;
    g) forming a gate in said gate opening and raised source/drain (S/D) blocks in said source/drain openings;
    h) removing said spacer blocks to form spacer block openings;
    i) forming second LDD regions by implanting ions through said spacer block openings;
    j) forming second spacer blocks in said spacer block openings;
    k) forming plug opening through said raised source/drain (S/D) blocks; and
    l) forming contact plugs in said plug opening.

2. The method of claim 1 wherein said first insulating layer comprised of silicon oxide.

3. The method of claim 1 wherein said first insulating layer having a thickness of between about 1000 and 3000 Å.

4. The method of claim 1 wherein said first lightly doped drain regions have a concentration between 1E17 and 1E18 atom/cc and a depth between about 0.08 and 0.15 μm.

5. The method of claim 1 wherein said first dielectric layer is comprised of silicon oxide and has a thickness of between about 20 and 50 Å.

6. The method of claim 1 wherein said gate and said raised source/drain (S/D) blocks are fabricated by forming a conductive layer over said first insulating layer and said first dielectric layer and chemical-mechanical polish (CMP) said conductive layer.

7. The method of claim 1 wherein said gate and said raised source/drain (S/D) blocks are comprised of polysilicon.

8. The method of claim 1 wherein said second lightly doped drain regions have a concentration between 1E17 and 1E19 atom/cc and a depth between about 200 and 1500 Å.

9. The method of claim 1 wherein said contact plugs are comprised of tungsten (W).

10. The method of claim 1 wherein said contact plugs are comprised of tungsten (W) formed by depositing a blanket W layer and chemical-mechanical polishing (CMP) said blanket W layer.

11. A method of fabrication of an elevated source/drain (S/D) for a MOS device; comprising the steps of:
    a) forming a first insulating layer over a substrate;
        (1) said first insulating layer has a thickness of between about 1000 and 3000 Å;
    b) forming a gate opening and source/drain openings in said first insulating layer exposing said substrate; said gate opening defines a channel region in said substrate; said source/drain (S/D) openings define first LDD source/drain area in said substrate; said gate opening and said source/drain (S/D) openings defining spacer blocks of said first insulating layer;
    c) forming a LDD resist mask having openings over said source/drain openings in said first insulating layer;
    d) implanting ions through said source/drain openings form said first lightly doped drain regions in said substrate;
    e) removing said LDD resist mask;
    f) forming a first dielectric layer on said substrate in said gate opening and source/drain openings;
        (1) said first dielectric layer is comprised of silicon oxide and has a thickness of between about 20 and 50 Å;
    g) forming a gate in said gate opening and raised source/drain (S/D) blocks in said source/drain openings;
        (1) said gate and said raised source/drain (S/D) blocks are fabricated by forming a conductive layer over said first insulating layer and said first dielectric layer and chemical-mechanical polish (CMP) said conductive layer;
        (2) said gate and said raised source/drain (S/D) blocks are comprised of polysilicon;

h) removing said spacer blocks to form spacer block openings;
i) forming second LDD regions by implanting ions through said spacer block openings;
j) forming second spacer blocks in said spacer block openings;
k) forming plug opening through said raised source/drain (S/D) blocks;
l) forming contact plugs in said plug opening;
  (1) said contact plugs are comprised of tungsten (W) formed by depositing a blanket W layer and chemical-mechanical polishing (CMP) said blanket W layer.

12. The method of claim 11 wherein said first insulating layer is comprised of silicon oxide.

13. The method of claim 11 wherein said first lightly doped drain regions have a concentration between 1E17 and 1E18 atom/cc and a depth between about 0.08 and 0.15 $\mu$m.

14. The method of claim 11 wherein said second lightly doped drain regions having a concentration between 1E17 and 1E19 atom/cc and a depth between about 200 and 1500 Å.

15. A method of fabrication of an elevated source/drain (S/D) for an MOS device; comprising the steps of:
  a) forming a first insulating layer over a substrate;
    (1) said first insulating layer is comprised of silicon oxide;
    (2) said first insulating layer having a thickness of between about 1000 and 3000 Å;
  b) forming gate opening and source/drain openings in said first insulating layer exposing said substrate; said gate opening defines a channel region in said substrate; said source/drain (S/D) openings define first LDD source/drain area in said substrate; said gate opening and said source/drain (S/D) openings defining spacer blocks of said first insulating layer;
  c) forming a LDD resist mask having openings over said source/drain openings in said first insulating layer;
  d) implanting ions through said source/drain openings form said first lightly doped drain regions in said substrate;
    (1) said first lightly doped drain regions have a concentration between 1E17 and 1E18 atom/cc and a depth between about 0.08 and 0.15 $\mu$m;
  e) removing said LDD resist mask;
  f) forming a first dielectric layer on said substrate in said gate opening and source/drain openings;
    (1) said first dielectric layer is comprised of silicon oxide and has a thickness of between about 20 and 50 Å;
  g) forming a gate in said gate opening and raised source/drain (S/D) blocks in said source/drain openings;
    (1) said gate and said raised source/drain (S/D) blocks are fabricated by forming a conductive layer over said first insulating layer and said first dielectric layer and chemical-mechanical polish (CMP) said conductive layer;
    (2) said gate and said raised source/drain (S/D) blocks are comprised of polysilicon;
  h) removing said spacer blocks to form spacer block openings;
  i) forming second LDD regions by implanting ions through said spacer block openings;
    (1) said second lightly doped drain regions having a concentration between 1E17 and 1E19 atom/cc and a depth between about 200 and 1500 Å;
  j) forming second spacer blocks in said spacer block openings;
  k) forming plug opening through said raised source/drain (S/D) blocks;
  l) forming contact plugs in said plug opening;
    (1) said contact plugs is comprised of tungsten (W) formed by depositing a blanket W layer and chemical-mechanical polishing (CMP) said blanket W layer.

* * * * *